United States Patent [19]

Macovski

[11] Patent Number: 4,551,680
[45] Date of Patent: Nov. 5, 1985

[54] SELECTIVE REGION NMR PROJECTION IMAGING SYSTEM

[76] Inventor: Albert Macovski, 2505 Alpine Way, Menlo Park, Calif. 94025

[21] Appl. No.: 487,294

[22] Filed: Apr. 21, 1983

[51] Int. Cl.⁴ ............................................. G01R 33/08
[52] U.S. Cl. .................................... 324/309; 324/307
[58] Field of Search ............... 324/306, 300, 307, 309, 324/311, 313, 314

[56] References Cited

U.S. PATENT DOCUMENTS

| 4,322,684 | 3/1982 | Hounsfield | 324/309 |
| 4,340,862 | 7/1982 | Percival | 324/309 |
| 4,486,708 | 12/1984 | Macovski | 324/309 |

Primary Examiner—Michael J. Tokar
Attorney, Agent, or Firm—Flehr, Hohbach, Test, Albritton & Herbert

[57] ABSTRACT

Two-dimensional projection measurements are formed of the NMR activity of a selected region of a volume. These represent different properties of the materials within the volume including density and relaxation times. The measurements of the different properties are processed to produce projection images of specific materials within the volume. Projection images are also obtained of moving materials only to provide isolated vessel images.

22 Claims, 7 Drawing Figures

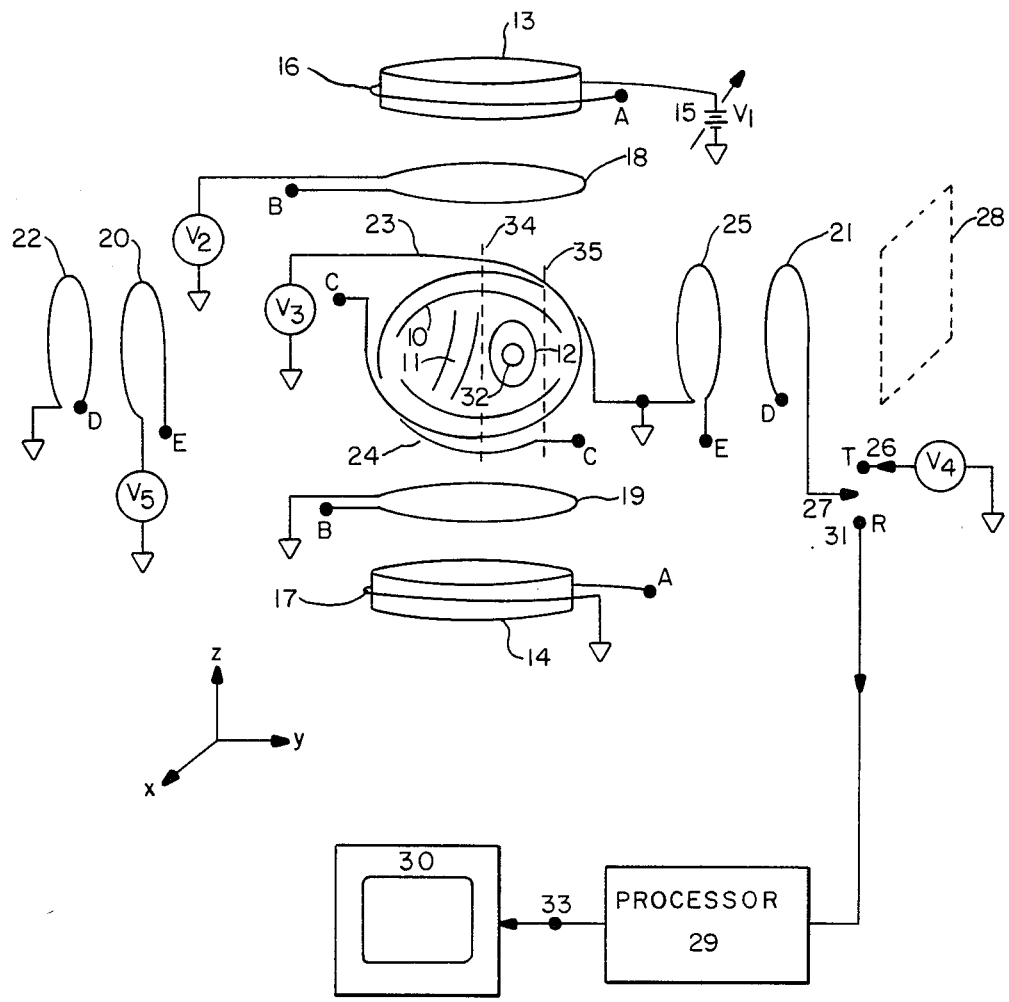
FIG.—1

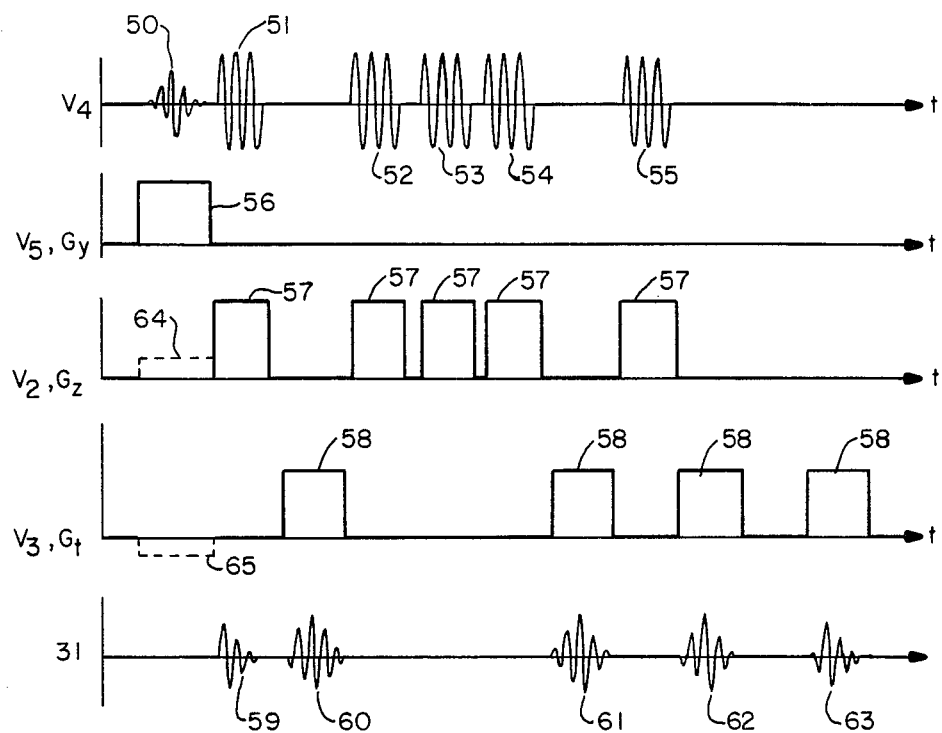
FIG.—2
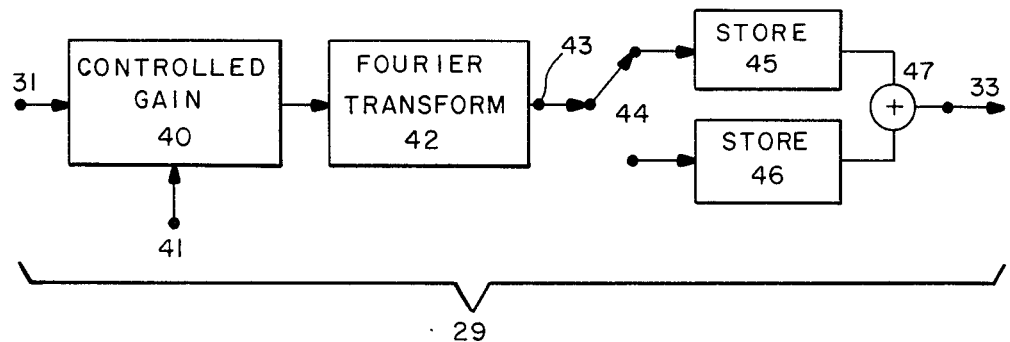
FIG.—3

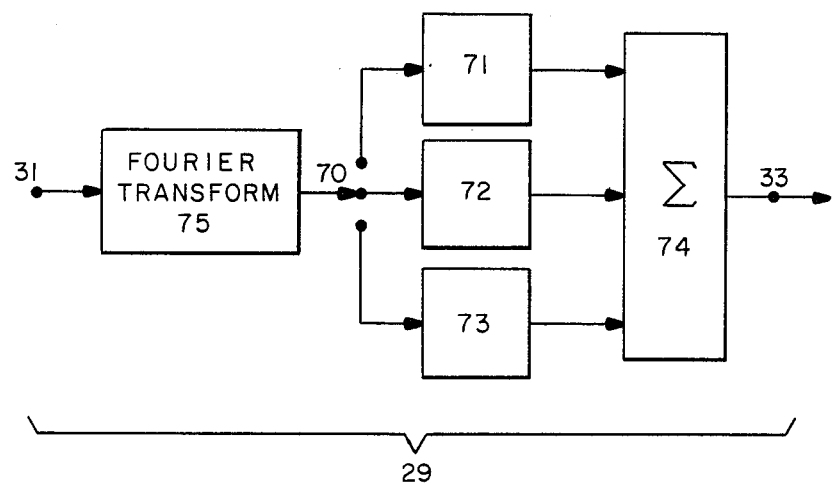
FIG.—4
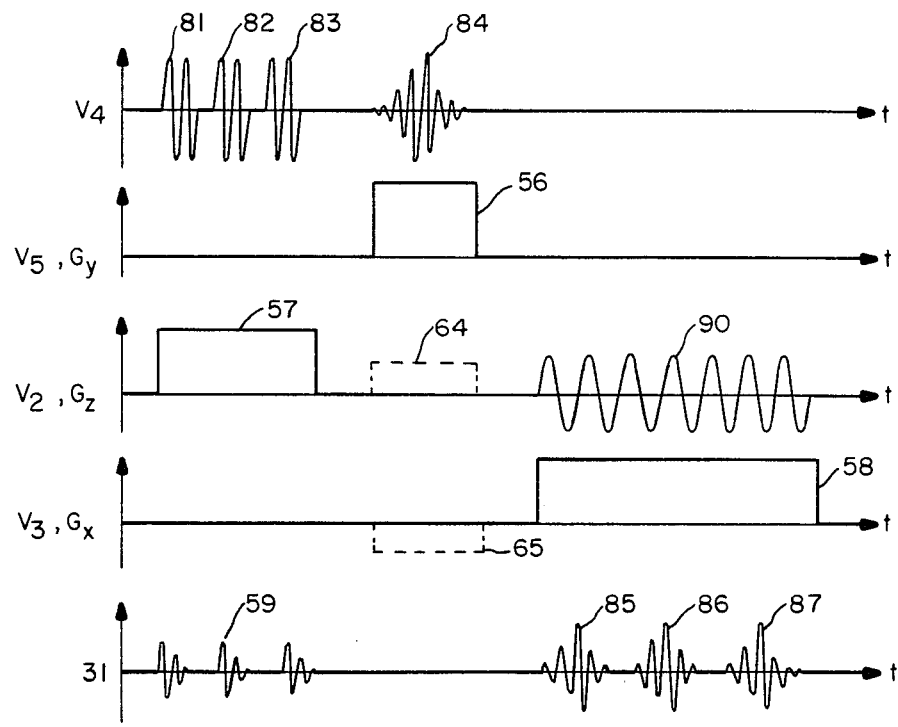
FIG.—5

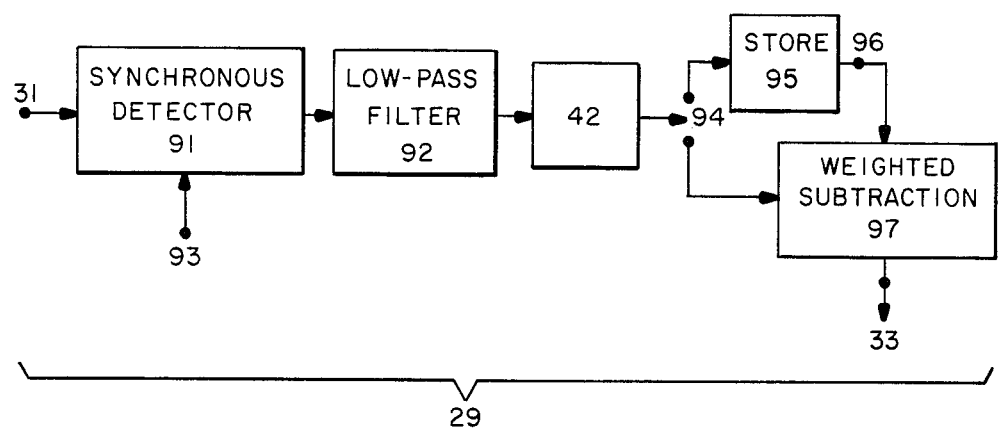
FIG.—6
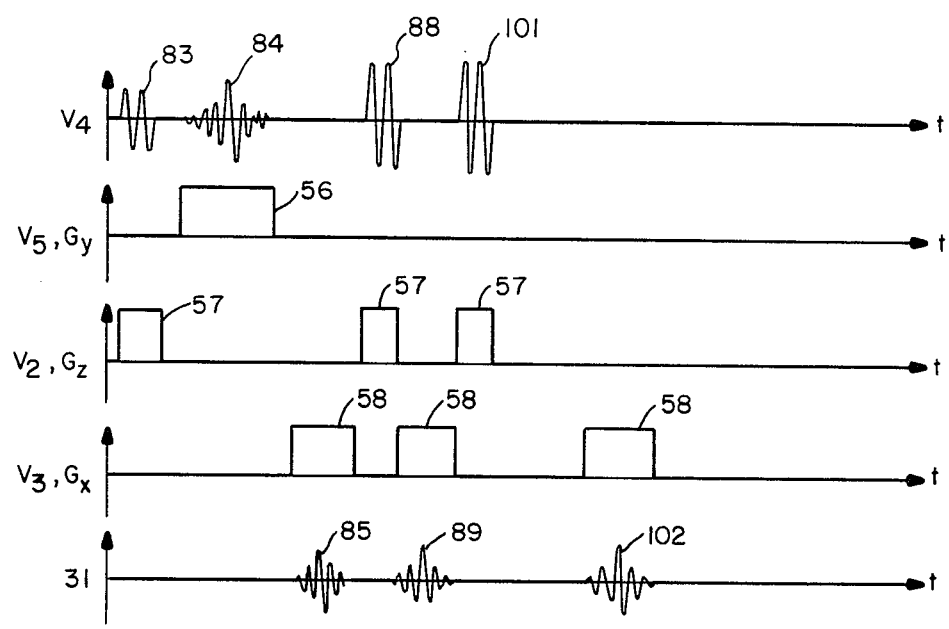
FIG.—7

SELECTIVE REGION NMR PROJECTION IMAGING SYSTEM

BACKGROUND OF THE INVENTION

1. Field of the Invention

This invention relates to medical imaging systems using nuclear magnetic resonance. In a primary application the invention relates to projection imaging over selected regions.

2. Description of Prior Art

Nuclear magnetic resonance, abbreviated NMR, represents a new approach to medical imaging. It is completely non-invasive and does not involve ionizing radiation. In very general terms, magnetic moments are excited at specific spin frequencies which are proportional to the local magnetic field. The radio frequency signals resulting from the decay of these spins are received using pick-up coils. By manipulating the magnetic fields, an array of signals are provided representing different regions of the volume. These are combined to produce a volumetric image of the density of the body.

A descriptive series of papers of NMR appeared in the June 1980 issue of the *IEEE Transactions on Nuclear Science*, Vol. NS-27, pp. 1220–1255. The basic concepts are described in the lead article, "Introduction to the Principles of NMR" by W. V. House, pp. 1220–1226.

A number of three-dimensional methods are described. One important one is described by P. V. Lauterbur and C. M. Lou entitled, "Zeugmatography by Reconstruction from Projections," pp. 1227–1231. In this approach, a linear field gradient is superimposed on the strong axial magnetic field. As a result of the gradient, each plane in the volume, in a direction normal to the gradient, experiences a different resonant frequency. A burst, containing a spectrum of frequencies, is used to simultaneously excite each of the planes. The received signal, following the excitation, is then Fourier transformed into its individual components. The amplitude at each frequency represents a planar integration of the proton density. This process can be repeated using a gradient field in different directions to collect information about arrays of planes. These planar integrals can be used to produce two-dimensional projection images of a volume or, alternatively, three-dimensional information about the proton density of each voxel in the volume.

The projection image is obtained by obtaining the integrated density of substantially all planes which are normal to the plane of the projection image. The total number of planes required, at all angles and positions, is substantially equal to the number of pixels in the two-dimensional projection image. The reconstruction procedure involves the classical reconstruction from projections widely used in current computerized tomography systems. The most generally used procedure is that of convolution-back projection.

The resultant two-dimensional projection images have a number of drawbacks and, as a result, are not used. Firstly, the superimposed intervening structures make it very difficult to visualize the desired structure, be it an organ or tumor. Secondly, the nature of this imaging procedure is such that all of the measurements affect every reconstructed pixel. This makes the image particularly sensitive to motion. Any motion of the object will cause artifacts in the image due to inconsistencies where the object does not match its projections. These artifacts can often obscure the desired information.

To avoid the problems of intervening structures, three-dimensional reconstructions are made which provides cross-sectional images. The approach taken in the Lauterbur paper involves making an array of two-dimensional projection images at every angle through the object. Lines in these projection images represent line integrals or projections of cross-sectional planes of the object. Thus, again using classical reconstruction techniques, any desired cross-sectional plane can be reconstructed. The intermediate two-dimensional projections are not used for the reasons discussed.

Although these cross-sectional images are free of intervening structures, they are unsuitable for many medical problems. The cross-sectional format is often difficult to interpret especially in the imaging of blood vessels. In addition, the acquisition of three-dimensional data takes a relatively long time, thus resulting in a variety of artifacts due to the various physiological motions of the body.

A number of articles and books have been published on the wide variety of ways of accomplishing cross-sectional or three-dimensional imaging using NMR. These include books *Nuclear Magnetic Resonance Imaging in Medicine*, published in 1981 by Igaku-Shoin Ltd., Tokyo, *NMR Imaging in Biomedicine*, by P. Mansfield and P. G. Morris published in 1982 by Academic Press, and review papers "NMR Imaging Techniques and Applications: A Review," by Paul A Bottomley in the *Review of Scientific Instruments*, Vol. 53, pp. 1319–1337, 1982, and "Fourier Transform Nuclear Magnetic Resonance Tomographic Imaging," by Z. H. Cho, et al., *Proc. of the IEEE*, Vol. 70, pp. 1152–1173, 1982. In each of these, as previously indicated, systems are described of producing cross-sectional or three-dimensional images. These are unsuitable in many clinical studies where it is important to view an organ in its entirety in a volume. This is particularly true in the vital application of vessel imaging where, as in existing angiography, vessel narrowings are studied by viewing a projection image of a vessel in a volume. A cross-sectional image showing slices through vessels has limited diagnostic value.

The subject of projection imaging in NMR was first introduced by the applicant in two U.S. patent application Ser. No. 332,925 "Blood Vessel Imaging System Using NMR" and Ser. No. 332,926 "Selective Material Projection Imaging System Using NMR." These were followed by a publication in the *IEEE Transactions on Medical Imaging*, Vol. 1, No. 1, pp. 42–47, 1982 entitled "Selective Projection Imaging: Applications to Radiography and NMR." In addition, the applicant has submitted two additional pending applications on this same subject matter entitled "Improved Blood Vessel Projection Imaging System Using NMR," and "Improved Selective Material Projection Imaging System Using NMR."

Each of these patent applications and the publications address a vital problem in projection imaging, namely the selective imaging of a specific region within the body. In X-ray we are limited to projecting the entire volume, since each X-ray photon must enter on one side of the volume of interest and emerge on the other. In NMR, however, we can accomplish the very important function of projecting over a desired portion of the volume. This can be vital in applications such as the coronary arteries where many intervening structures such as pulmonary vessels and heart chambers can obscure the desired image. Thus, in projection imaging, region selectivity can be vital.

In the previous applications a number of methods were shown, including the insensitization of the undesired regions of the volume so that only the desired regions will project. An improved version of this method involved further insensitization preceding each data acquisition. However, what is most desired, is a system of accurately exciting only the region of interest so that undesired regions are automatically excluded. This would take care of those circumstances where the previous methods might prove inadequate or overly complex.

SUMMARY OF THE INVENTION

An object of this invention is to provide NMR projection image of a selected region.

A further object of this invention is to provide NMR projection images of specific materials.

A further object of this invention is to provide NMR projection images of flowing materials.

Briefly, in accordance with the invention, a magnetic gradient and a wideband excitation signal are used to excite only a selected region of a volume. Additional excitations, representing the projection of each planar section, produce spin echo signals only in those regions which have experienced both excitations. The resultant received signals thus represent only the selected region. These excitations are combined with sequences which respond only to moving material, with static material cancelled, enabling isolated images to be made of blood vessels.

BRIEF DESCRIPTION OF THE DRAWINGS

For a more complete disclosure of the invention, reference may be made to the following detailed description of several illustrative embodiments thereof which is given in conjunction with the accompanying drawings, of which:

FIG. 1 is a schematic diagram illustrating an embodiment of the invention;

FIG. 2 is a set of waveforms illustrating an embodiment of the invention;

FIG. 3 is a block diagram illustrating an embodiment of the invention for providing more accurate images representing the relaxation times;

FIG. 4 is a block diagram illustrating an embodiment of the invention for providing images of selected materials;

FIG. 5 is a set of waveforms illustrating an alternate embodiment of the invention.

FIG. 6 is a block diagram illustrating an embodiment of the invention for imaging flowing materials; and FIG. 7 is a set of waveforms illustrating an embodiment of the invention for imaging flow.

DESCRIPTION OF THE PREFERRED EMBODIMENT

An understanding of the broad aspects of the invention may best be had by reference to FIG. 1. Here it is desired to selectively image specific features of the anatomy in volume 10 of the human body. For example, 11 can represent a vessel structure which it is desired to visualize. Alternatively, vessel structure 11 may be interfering with the visualization of soft tissue structure 12, which can represent the liver, kidneys, brain, etc. Also, it is often important to visualize regions of disease such as is illustrated by tumor 32 imbedded in soft tissue structure 12.

The methods employed in accomplishing these imaging tasks using NMR have thusfar employed cross-sectional imaging. This format is used since it avoids the problem of intervening structures. However, these approaches have many limitations including relatively long data acquisition time, poor resolution, poor SNR and a limited field of view. Although these parameters can be traded off, such as obtaining better resolution or SNR at the expense of a longer data acquisition time, the overall performance remains marginal.

Many of these problems can be solved by obtaining projection rather than cross-sectional images. These have a field of view encompassing the entire volume of interest. Also, since many fewer measurements are fundamentally required, systems with much shorter acquisition times, higher resolution and improved SNR can be structured.

The fundamental problem with these systems, as with all projections imaging, is that of intervening material obscuring the region of interest. In this invention, however, we provide methods of selectivity removing undesired intervening structures so that projection images are obtained of solely the region of interest, with all of the associated advantages.

We will first describe the general NMR system imaging portions of volume 10. In general the principal axial magnetic field is produced using, for example, pole pieces 13 and 14 excited by coils 16 and 17. These are driven by a d.c. source $V_1$ with the coils 16 and 17 producing fields in the same direction to create a substantially uniform field throughout the region of interest in volume 10. This is by far the strongest field in the system with a strength of the order of one kilogauss. With both this coil and the remaining coils, the letter pairs A-E are simply convenient ways of indicating connections.

Specific regions are selected using the gradient coils. Coils 18 and 19 form a gradient field in the z direction driven by source $V_2$. Similarly coils 23 and 24 are on opposite sides of object 10 and thus form a gradient field in the x direction driven by source $V_3$ with coils 20 and 25 producing a gradient in the y direction driven by source $V_5$. Unlike coils 16 and 17 which create a uniform field, these gradient coils are bucking each other so as to produce a varying field in the respective direction.

Coils 21 and 22 are the radio frequency coils serving both the transmitter and receiver function. They produce fields in the same direction to create a substantially uniform field in volume 10. When switch 27 is in the transmit position, 26, generator $V_4$, is used to excite the magnetic spins in volume 10. When switch 27 is connected to the receive position, signal 31 is received from magnetic spin signals in volume 10. These are processed in processor 29 to provide a projection image of specific materials in volume 11. The resultant projection image is displayed in display 30. This is a projection of volume 10 in the y direction onto plane 28. Alternatively, separate transmitter and receiver coils can be used to minimize interaction.

A variety of combinations of excitation signals $V_4$ and processing systems 29 can be used to isolate specific materials, or moving blood in volume 10. The projections of these isolated structures, projected onto plane 28, are displayed in display 30.

Using specific excitations projections of the volume are obtained which are functions of $\rho$, $T_1$, and $T_2$, which are respectively the spin density, the spin-lattice or longitudinal relaxation time and the spin-spin or transverse relaxation time. Each material has a unique set of these three parameters. We can make a sequence of measurements, each of which represents the projection of one or more of these materials. Functionally, these can be described as $f_n(\rho, T_1, T_2)$ where $f_n$ is some function of one or more of these parameters. In general, a number of measurement techniques are used to provide different functional relationships $f_n$ of these parameters. These can then be combined to, for example, eliminate any material k which has a given set $\rho_k$, $T_{1k}$ and $T_{2k}$. Similarly, they can be combined to enhance and/or isolate any material which has a given set of these parameters. This capability allows projection imaging to be used to its fullest advantage; by isolating the region of interest and removing intervening structures. Since $T_1$ and $T_2$ vary with frequency, additional independent measurements can be obtained by varying $V_1$, the main field.

As an example, assume there are two materials in the projection path in volume 10, material A and material B. Using one of the projection imaging systems to be described, the resultant projection along the y axis of the free induction decay signal received is given by $$I_1 = \int \rho dy = \rho_a Z_a + \rho_b Z_b,$$

where $\rho_a$ and $\rho_b$ are the densities of the two materials and $Z_a$ and $Z_b$ are the path lengths in the y direction. Thus $Z_a$ and $Z_b$ are functions of x and z. Our desired isolated projection images are $Z_a(x,z)$ and $Z_b(x,z)$ since they represent the projections of specific materials. As the first step in isolating these projection images we store the projected measurement $I_1(x,z)$ in processor 29.

We then make a second measurement which includes a function of $T_1$. This can be accomplished by first exciting the volume with a 180° inversion excitation. This produces no FID signal. Then, after a time $t_a$, a 90° excitation is applied. The intensity of the received signal is given by $$I_2 = \int \rho[1 - 2e^{-t_a/T_1}]dy = \rho_a[1 - 2e^{-t_a/T_{1a}}]Z_a + \rho_b[1 - 2e^{-t_a/T_{1b}}]Z_b.$$

We thus have two equations representing the measured values $I_1(x,z)$ and $I_2(x,z)$ in terms of the two unknowns $Z_a(x,z)$ and $Z_b(x,z)$. The constants $\rho_a$, $\rho_b$, $T_{1a}$ and $T_{1b}$ are known for the materials of interest such as bone, soft tissue, etc. Solving these equations, we have $$Z_a(x,y) = \frac{I_2 - I_1 G_b}{\rho_a[G_a - G_b]}$$

where $$G_i = [1 - 2e^{-t_a/T_{1i}}].$$

Thus a separate isolated image is formed of the two-dimensional projection of material A. Similarly the $Z_b$ image is given by $$Z_b(x,y) = \frac{I_1 - \rho_a Z_a}{\rho_b}.$$

Once the $Z_a$ and $Z_b$ images are isolated, they can be used to cancel specific materials which are mixtures of these two components. For example, assume a lesion or organ material has a ratio r of $Z_a$ to $Z_b$. Then an image with this lesion cancelled $Z_1$ can be provided as given by $$Z_1 = Z_a - rZ_b.$$

In addition to cancelling some specific material, this approach can also be used for evaluating an unknown material, such as in determining whether a tumor is benign or malignant. A control can be placed on the ratio r. While observing the display, the clinician can vary this control until the lesion disappears. The resultant ration r is indicative of the material properties of the tumor.

We have thusfar dealt with signals representing two material properties, p and $T_1$. The transverse or spin-spin relaxation time $T_2$ is measured by first using a 90° excitation for $V_4$ providing a free induction decay. The intensity of this signal is the previously indicated $I_1$. After a time $t_b$, a 180° inversion is applied. This causes those signal phases caused by nonuniform magnetic fields to reverse and begin to move in phase, producing a spin echo signal at $2t_b$. The intensity of this signal $I_3$ is given by $$I_3 = \int \rho e^{-2t_1/T_2} dy = \rho_a e^{-2t_1/T_{2a}} Z_a + \rho_b e^{-2t_1/T_{2b}} Z_b = \rho_a H_a Z_a + \rho_b H_b Z_b,$$

where $$H_i = \exp[-2t_b/T_{2i}].$$

This additional piece of information can also be used to obtain isolated images of $Z_a(x,y)$ and $Z_b(x,y)$. More important, it can be used to isolate a third material $Z_c$. For example, the three measurements $I_1$, $I_2$, and $I_3$ can be used to make isolated projection images of the bone 11, soft tissue organ 12 and tumor 32 in volume 10.

Using matrix notation, the vector of intensity measurements is described by $$\bar{I} = \bar{M}\bar{Z}$$

where $\bar{I}$ is the measurement vector, $$\begin{bmatrix} I_1 \\ I_2 \\ I_3 \end{bmatrix}$$

$\bar{M}$ is the measurement matrix, $$\begin{bmatrix} \rho_a & \rho_b & \rho_c \\ \rho_a G_a & \rho_b G_b & \rho_c G_c \\ \rho_a H_a & \rho_b H_b & \rho_c H_c \end{bmatrix}$$

and $\bar{Z}$ is the material vector $$\begin{bmatrix} Z_a \\ Z_b \\ Z_c \end{bmatrix}$$

The solution to the three isolated material images is simply $$\bar{Z} = \bar{M}^{-1} \bar{Y}$$

where $\bar{M}^{-1}$ is the inverse of matrix $\bar{M}$, the solution to the three simultaneous equations.

In the previous application on projection imaging, by the same inventor, the important function of limiting the projection to a selected region of the volume was accomplished primarily by insensitizing the undesired regions of the volume. Although this can be adequately effective for some studies, it does have the potential problem of some degree of incomplete insensitization. Thus a strong signal in the undesired region can interfere with a weak signal in the desired region. This problem is especially important in projection imaging where these are superimposed in the final image.

In this invention a unique system is disclosed whereby only the desired region of the volume is excited, with the undesired portion not excited. This provides improved localization, as compared to insensitization methods.

Referring to FIG. 1, assume it is desired to produce a projection image of volume 10, projected in the y direction onto projection plane 28. In this projection, however, it is desired to eliminate structure 11, which would otherwise obliterate the desired structures 12 and 32 in the projection image. Therefore, the desired region of projection is between planes 34 and 35. The ability to isolate the region of interest enables any undesired structure to be eliminated.

The basis of the invention is a multiple excitation scheme which requires excitation of the desired portion of the volume. Referring to FIG. 2, an embodiment of the invention is illustrated. To excite the desired portion of the volume a broadband pulse 50 is used which has a tilt angle of substantially 90°. This is applied in the presence of y gradient $G_y$ driven by signal $V_5$, shown as signal segment 56. The purpose of the initial excitation is to limit the region over which the projection is made, as previously described.

Assume the distance between planes 34 and 35 is $\Delta y$ with the center at $y_1$. The bandwidth $\Delta \omega$ of the pulse 50 is therefore $$\Delta \omega = \gamma G_y \Delta y$$

where $\gamma$ is the classic magnetogyric ratio. The center frequency $\omega_1$ for this region is given by $$\omega_1 = \gamma B_0 + G_y \gamma y_1$$

where $\gamma B_0$ is the resonant frequency in the absence of gradients. Therefore signal 50 is of the form $$\text{sinc}\left( \frac{\gamma G_y \Delta y t}{2\pi} \right) \cos(\gamma B_0 + G_y \gamma y_1)t$$

where the sinc signal provides the desired rectangular bandwidth. As shown in FIG. 2, it may be desired to tilt the selected region so that it is at an angle to the normal of the projection direction. For example, to be sure that structure 11 is not included, the planes 34 and 35 can be tilted in the same direction as structure 11. This is accomplished using additional gradient components in $G_z$ and $G_x$, shown in dotted lines as signal segments 64 and 65 of $V_2$ and $V_3$. These change the gradient angle, thus tilting the selected region. The FID, signal segment 59, resulting from this 90° excitation, is ignored.

Following this excitation pulse 50, additional excitation is required to create the projection image. In the embodiment of FIG. 2 the spin echo method is used since this provides the required multiple excitations. In the presence of z gradient $V_2$, signal segment 57, a 180° narrow band rf burst is used at a frequency corresponding to a specific z plane. This will produce a spin echo at a time equal to the time between the 90° and 180° excitations. This results in received spin echo signal segment 60 in received signal 31. This spin echo is received in the presence of signal segment 58, an x gradient driven by $V_3$. This disperses the received spin echo into a band of frequencies representing the projection of different values of x in the y direction. Thus one line of the projection image is formed where the region of projection has been restricted between planes 34 and 35. The desired spatial localization is accomplished by a unique sequence of three gradient signals, a wideband and a narrow band excitation signal, producing spin echo.

To complete the projection image this same procedure can be repeated, not as shown, simply using different frequencies for burst 51 to represent different z planes. This is a satisfactory procedure, but will require a relaxation interval of the order of $T_1$ between excitations, thus extending the data acquisition time. An alternative approach is shown in the subsequent portions of FIG. 2. Here, while the excited nuclei in the desired region are slowly relaxing, additional planes are excited. For example, signal segments 52, 53 and 54 are narrow band excitations at different frequencies representing different z planes where $\omega = \gamma[B_0 + G_z z]$. Each are applied in the presence of the same $G_z$ gradient 57 and give rise to spin echoes 61, 62 and 63, all received in the presence of dispersal gradient signals 58. These signals, when Fourier transformed in processor 29, become the desired projection signals for three additional planes.

As previously indicated, the time for each spin echo from the time of the 180° pulse is equal to the time between the 90° excitation 50 and the 180° pulse for that plane. Therefore, as shown in FIG. 2, the 180° excitation pulses must be interleaved between the various spin echoes. For example burst 55 is interleaved between spin echoes 61 and 62. Its resultant spin echo is not shown. This interleaving is not as difficult as shown in FIG. 2 since the duration of the 180° burst is normally much shorter than that of a spin echo.

During the collecting time interval the various received signals 31 are decaying at a rate of approximately $e^{-t/T_2}$ where t is the time measured from the 90° burst 50. If the various planar signals are collected in a time short as compared to $T_2$, no compensation is required. However, if a relatively large number of planes are to be acquired at each excitation, the time duration will begin to be comparable to $T_2$. In that case, various compensation measures can be employed in processor 29, as shown in FIG. 3. One simple approach is to simply multiply the received signals by $e^{t/T_2}$, to compensate for the exponential decay. Thus signal 31 is applied to controlled gain amplifier 40 which is driven by signal 41. Since $T_2$ is not known, signal 41 becomes $e^{-t/\overline{T_2}}$ where $\overline{T_2}$ is the average or anticipated value of $T_2$, which is known for regions of the anatomy.

A more precise compensation system, which does not depend on knowledge of $T_2$, is also shown in FIG. 3. Here, ignoring controlled amplifier 40, the transformed projection signals 43 from each plane are first stored in storage unit 45 by switching switch 44 to the upper position. The stored signals from each point in the volume are of the form $ae^{-t_1/T_2}$ where $t_1$ is the time from burst 50. To compensate, following a relaxation interval, another complete set of measurements are taken with the sequence reversed so that a plane excited first, corresponding to burst 51 for example, will now be excited last. The second set is stored is storage unit 46 with switch 44 in the lower position. Each point in the volume now provides a signal of the form $ae^{-t_2/T_2}$. When these signals are added in adder 47 they form output signal 33 of the form $a[e^{-t_1/T_2} + e^{-t_2/T_2}]$. This can be restructured to the form $$v = ae^{-\tau/T_2}[e^{-t'/T_2} + e^{t'/T_2}]$$

where $\tau = (t_1 + t_2)/2$, the mean of the two observation times and $t' = (t_1 - t_2)/2$, the time between each observation and the mean time $\tau$. note that if $t' << T_2$, that is where the time differences are small compared to $T_2$, we can use the first two terms of the expansion $$e^x = 1 + x + x^2/2 + \ldots$$

and arrive at the result $$v \cong 2ae^{-\tau/T_2}$$

Therefore, if $(t_1 + t_2)/2 = \tau$ for each pair of measurements corresponding to each projection, then the difference in time delay will be completely compensated for. Where a relatively large number of measurements are made in a single relaxation period, $t'$ begins to be comparable to $T_2$, and the approximation is no longer valid. In that case the sum can be approximated as $$v \cong 2ac^{-\tau/T_2}[1 + \tfrac{1}{2}(t'/T_2)^2]$$

Note that even for $t' = \tfrac{1}{2}T_2$, corresponding to the difference in the measuring times being half of $T_2$, the error is about 3%. However, the bulk of this error can be corrected by weighting each measurement pair with $[1 + \tfrac{1}{2}(t'/\overline{T_2})^2]^{-1}$, where again $\overline{T_2}$ is the average or anticipated value of $T_2$. This correction can be applied to each measurement pair either as control signal 41 in controlled gain amplifier 40, or alternatively using a similar controlled gain function, not shown, after adder 47.

It should be emphasized, however, that none of these compensation approaches are critical because we are dealing with projection imaging, where each region in isolation represents the line integral through the region of interest. This is in sharp contrast to cross-sectional imaging where the measurements interact in the reconstruction process. A similar compensation approach is used in the pending application by the same inventor "High-Speed NMR Imaging System" where the compensation is much more critical.

The method described thusfar provides primarily a density signal, with some dependence on $T_2$ of the form $\rho e^{-\tau/T_2}$. In selective imaging, as described in the pending U.S. application Ser. No. 332,926, it is highly desirable to achieve projection imaging measurements of a variety of NMR components and combine these to selectivity image specific materials. To do this, we repeat the measurements of FIG. 2, with modifications, to provide the sensitivity to other parameters. To achieve additional $T_2$ sensitivity we introduce a delay between the 90° excitation using signal segment 50, with its associated gradients, and the first 180° excitation 51. Thus $\tau$ is significantly increased so that the two sets of measurements, with and without the additional delay, allow the isolation of both $\rho$ and $T_2$.

For $T_1$ measurements we return to the classic inversion recovery sequence widely discussed in the literature. At a time $\tau_1$ prior to the wideband burst 50, not shown, we use a 180° wideband burst which, for example, is identical to burst 50, but with twice the amplitude. The identical gradient signals 56, 64, and 65 as are used with burst 50 are used with this added 180° burst. As with classical $T_1$ measurements, assuming the system is initially fully polarized. The first signal, signal segment 60, will be of the form $$v = \rho(1 - 2e^{-\tau_1/T_1})$$

providing the desired $T_1$ sensitivity. Subsequent measurements, such as signal segments 61-63, will have an added $T_2$ component of the form $$v = \rho(1 - 2e^{-\tau_1/T_1})e^{-t/T_2}$$

Again, the final $T_2$ factor can be dealt with, as before, by weighting with $e^{-e/\overline{T_2}}$ in 40, or by combining two sets of measurements as in FIG. 3. In any case, using the three sets of measurements previously described, which have different sensitivities to $\rho, T_1$ and $T_2$, images sensitive to different materials can be reconstructed as described in U.S. application Ser. No. 332,926 and shown in FIG. 4. Here the various measurements from signal 31 are transformed to form the projection values and stored in storage structures 71, 72 and 73. These are then applied to weighted summer 74 which weights each stored output with some positive or negative number and then sums the result to either cancel an undesired material or enhance a desired material. As described in a pending application by the same inventor, "Improved Selective Material Projection Imaging Using NMR," additional independent measurements of $T_1$ and $T_2$ can be obtained by taking advantage of their frequency sensitivity. For example, by varying $V_1$ to alter the main magnetic field, the same measurements are made at different frequencies. Using additional storage structures, not shown, these are also applied to summer 74 to provide further material discrimination.

The important additional contribution of this invention to the selective projection imaging is again the active procedure for exciting solely the region of interest, excluding undesired structures, whether or not they represent the same material.

The selective-region method described thusfar involved essentially two excitations, a broadband one which define the selected region followed by a narrow band excitation which defined the planar section being measured. The resultant signals 60-63, were the result of both excitations. In FIG. 2, the broadband selective region excitation came first. In the embodiment of FIG. 5, the narrow band plane selection precedes the wideband selective region excitation. In some ways, this represents a simpler embodiment.

A sequence of planes are first excited by 90° bursts 81, 82 and 83 in the presence of a $G_z$ gradient indicated, as before, as signal segment 57. Three burst are shown as exemplary, although many more can be used in the interest of rapid data acquisition. Since each of these excitations are of different frequencies, they exit different z planes due to the presence of the z gradient. Each of these 90° excitations results in an FID, shown for example as signal segment 59. These are all ignored since they do not represent the result of an entire imaging sequence. Following this sequence of excitations, broadband 180° burst 84 is used, as before with y gradient signal segment 56, to selectively excite only the desired region of interest. This signal is essentially the same general form as signal 50 in FIG. 2. For example, 84 could be identical to 50, but with the amplitude doubled. Now the desired portions of each of the previously excited planes have received two excitations and can therefore produce spin echo signals. Also, as before, the planes defining the desired region can be tilted using segments 64 and 65.

Spin echo signals 85–87 result from these dual excitations. A.C. gradient signal 90 can be ignored and will subsequently be described. Since the time of a spin echo from the 180° pulse is equal to the time between the 90° and 180° pulses, segment 85 comes from 83, 86 from 82, and 87 from 81. These are received in the presence of x gradient signal 58, as before, to disperse the signal into an array of x values representing line projections in the y direction for each plane.

Again, if the times involves are sufficiently short, the outputs will represent the line integrals or projections of the density $\rho$. If longer times are involved the received signals represent $\rho e^{-t/T_2}$ where t is the time between the 90° planar excitation and the received spin echo. All of the methods previously described in connection with FIG. 2 can be used to cause each processed measurement to represent the same effective time. These include weighting with $e^{t/T_2}$, or combining sets of measurements where the planes are excited in a reverse sequence, so that the average time is the same for each plane. Also, the sum of planes can be further corrected using the quadratic component $[1+\frac{1}{2}(t'/T_2)^2]$.

For selective material imaging independent sensitivity to $\rho$, $T_1$ and $T_2$ are desired. As before, additional $T_2$ sensitivity is obtained by imposing a delay between 83 and 84. This further delays all of the spin echoes, giving a strong $T_2$ sensitivity. Also, the inversion recovery sequence can again be used to provide the desired $T_1$ sensitivity. Here, at a time $\tau$ prior to the first planar excitation 81, a global 180° inversion is applied, not shown, to invert the spins in the volume of interest. This can take any of a number of convenient forms. It can simply be a narrow band 180° pulse in the absence of any gradients, or a broadband 180° pulse in the presence of gradients, which is less critical as to frequency. Alternatively it can be an adiabatic fast passage pulse consisting of a swept frequency signal going through resonance, which provides a more accurate 180° inversion. In any case the resultant spin echoes will, as before, be taken on the $(1-2e^{-\tau/T_1})$ factor to provide $T_1$ sensitivity. The resultant measurements are again processed as previously described using FIGS. 3 and 4 to provide selective material imaging with the added unique feature of active spatial selection.

Thusfar a variety of projection imaging approaches have been disclosed involving various properties of materials. From a clinical point of view, however, one of the most useful applications is that of blood vessel imaging. Here, as described in the previous applications by the same inventor, U.S. application Ser. No. 332,925 and, more recently, "Improved Blood Vessel Projection Imaging System Using NMR" vessels are imaged by being responsive solely to the moving material, and cancelling all static material. Also, these images are formed in the projection mode so that the entire vessel is visualized as it traverses the volume, allowing regions of narrowing to be observed and evaluated. In these applications, methods are shown of limiting the projection to desired regions, to avoid the superposition of undesired structures. In one method for accurate delineation of the desired region, the undesired regions are first insensitized. This can provide incomplete selection. In the system of this invention a unique method of exciting only the desired regions is shown along with the following material on limiting the projected image to moving material for blood vessel imaging.

The method shown in FIG. 5 can be used to image blood vessels. The method is the same as previously described with the addition of a.c. gradient signal 90 in the z direction. The purpose of this is to provide further selection in the z direction by making use of the fact that only one plane will have a null a.c. signal. If terminals B are connected in FIG. 1, the plane between coils 18 and 19 will be the null plane. If, however, the upper B terminal is grounded, and the lower B terminal is driven with $kV_2$, the plane of interest can be varied. If $k=1$, the plane will again be in the center. Values of $k>1$ will result in a lower null plane. Thus controlling k controls the plane of interest.

This general approach using a.c. gradients is described in a paper by W. S. Hinshaw in the *Journal of Applied Physics*, Vol. 47, p. 3709, 1976. To eliminate all but the null plane, a low pass filter is applied to signal 31 after synchronous detection as is usually employed. Prior to subsequent processing the a.c. gradient frequency must therefore be chosen sufficiently high so that the low pass filter will not remove any of the desired frequency components generated by the x gradient which define the line of projection signals.

In general excited nuclei flowing into adjacent regions can be imaged by receiving signals solely from regions adjacent to the excited plane, and not that of the plane itself. For example, as shown in FIG. 5, in the absence of a.c. gradient 90, signals 85, 86 and 87 result from specific excited planes. Using the a.c. gradient 90, however, one plane, depending on k as previously described, will produce a null and have a residual signal. That plane can be chosen to be above or below the excited plane, depending on k. In this way flow in either direction can be imaged so that separate images of venous and arterial flow can be made. A different value of k is therefore used for each spin echo 85–87.

As shown in FIG. 6, these signals are synchronously detected in synchronous detector 91 driven by signal 93 which is derived from the various excitation frequencies used in signals 81–83 respectively. Detector 91 can represent dual synchronous detectors using cosine and sine multipliers as have become standard practice in Fourier transform NMR. Low pass filter 92 cuts off below the a.c. gradient frequency of signal 90 so as to filter out these variations and select the null plane. The filter is wide enough, however, to retain the spectrum induced by the x gradient $G_z$. The spectrum of frequencies are Fourier transformed in 42 as before, to provide the desired image. Thus the use of the a.c. gradient 90 and subsequent processing has provided the desired image of flow only, while maintaining the important restriction to the desired region.

In some cases the slice selection provided by the a.c. gradient may not be sufficiently narrow to avoid the excited slice, resulting in some static material appearing in the flow image. This can be compensated for as shown in the remaining portions of FIG. 6. Here a static image is first made, without the a.c. gradient, as previously described. This is stored in storage unit 95, with switch 94 in the upper position, either on a line or image basis. Next, using the a.c. gradient to receive signals from adjacent planes, with switch 94 in the lower position, a portion of the stored static image 96 is subtracted from the flow image in subtractor 97 to cancel the residual static image due to overlap of the slices. In addition to providing cancellation for an undistorted flow image, signal 96 can also be used in various display modes where, for example, the static anatomy is displayed in one color and the flowing blood in another.

The system just described produced directional flow images of a selected region. If directionality is not significant, and the important result is imaging all flow in a selected region, a simpler approach can be used. Referring again to FIG. 5, and again ignoring a.c. gradient 90, excitation signals 81-83 are replaced with 180° rather than 90° burst. Thus those shown in FIG. 5 are simply doubled in amplitude or time, or some intermediate combination. With static material, successive 180° bursts produce no signal. Flowing signals in each plane, however, fail to experience the complete 180° inversion and will produce spin echo signals 85-87, now representing solely moving material. Thus the simple expedient of 180° rather than 90° initial excitation results in flow images.

The length of 180° burst 81-83 can be adjusted to optimize the flow image by selecting the appropriate time duration. For example, considering the width of the planar section, the time can be adjusted for the average flow velocity such that each flowing nuclei is within the excited section for about half of the 180° burst interval. This results in effectively a 90° excitation for maximum response. However, this is clearly non-critical since anything shorter than 180° excitation will produce a signal. Any residual static material due to errors in the excitation tipping angles can be cancelled as previously described.

FIG. 7 illustrates an additional embodiment for directional flow which does not involve a.c. gradients. For simplicity a single plane is illustrated. The beginning is identical to that of FIG. 5 where a plane is excited with 90° burst 83 whose frequency, along with gradient 57, in the presence of y gradient 56, defines the region of interest. Spin echo signal 85, received in the presence of x gradient 58, then provides the static projection of the selected planar section.

For flowing imaging an added 180° burst 88 is used whose frequency, in conjunction with z gradient signal segment 57 excites a plane adjacent to that originally excited by 83, either above or below. For those nuclei that have flowed into this plane, an additional spin echo 89 is produced which indicates flow only and in one direction. Signal 89 is again dispersed with x gradient signal 58 to represent the projection lines in that plane. Signal 89 is processed, as previously described using a Fourier transform, to provide the projection signals representing directional flow. If the flow in both directions is desired, additional 180° pulse 101 is used to excite an adjacent plane opposite to that of 88. The nuclei that have flowed into that plane will produce spin echo 102, based on the original spin echo 85.

Thus 85, 89 and 102 can be used to provide bi-directional flow and static imaging. The entire sequence can be repeated for other planar sections to form a complete image. Composite displays can again be used. Also, the static image resulting from 85 and similar signals can be used to cancel residual static image signals in 89 and 102, as previously described.

All of the foregoing projection flow imaging approaches have been based on the general region-selection system of FIG. 5 where plane selection occurs first followed by region selection. A similar array of flow imaging approaches can be based on the general system of FIG. 2 where the regional selection occurs first followed by plane selection. Referring to FIG. 2, burst 50 can be modified in two ways. Firstly its amplitude or width is doubled so that it represents a 180° burst rather than a 90° burst. Secondly, its spectrum is altered so that within the spectrum covered, the spectral response is a "comb" of excitation bands interleaved with non-excited spectral regions as described in previously referenced U.S. application Ser. No. 332,926. This can be accomplished by first taking a narrow band signal and sampling it to produce a repetitive set of excitation bands. If the sampling rate is about four times the bandwidth of the narrow band signal, a spectrum alternating between excitation and no excitation will be formed. In addition, this spectrum must be band-limited to correspond to planes 34 and 35 in FIG. 1. The y gradient 56 results in this spectrum corresponding to the excitation of specific regions along the y direction.

Thus "comb" excitation signal 50, being 180°, will result in no excitation of static regions. Moving material, however, such as blood in vessels, will move from excited to unexcited regions, and vice versa, thus experiencing partial excitations, less than 180°. These will result in spin echo signals 60-63, as before, except representing only moving material.

A system similar to that of FIG. 7 can also be used where the wideband and narrow band burst are interchanged, with their associated gradients, so that a wideband 90° signal with a y gradient is followed by a narrow band 180° signal with a z gradient, as in the beginning of FIG. 2. Then, as shown in FIG. 7, the first spin echo 85, representing static structures, can be followed by bursts 88 and 101 on either side of the section originally excited by the narrow band burst to produce spin echoes 89 and 102 representing flow into the adjacent sections. One problem with this approach is that, with this reversed configuration, 88 and 101 will produce additional spin echoes in conjunction with the initial wideband 90° pulse. This can readily be overcome by carefully interleaving the various spin echo signals resulting from static and flow excitations, to provide the desired image. In general both 90° excitations and spin echoes can produce subsequent spin echoes which represent static information if the same region is excited, and flow if adjacent regions are excited.

The a.c. gradient shown in conjunction with FIG. 5 can also be used with the system of FIG. 2 to image flow or vessels. Note that each spin echo in FIG. 2, signal segments 60-63, are received in the absence of a z gradient, $V_2$, so that no z selection occurs during the time signal are received. In an a.c. z gradient, such as signal 90 in FIG. 5, is used during the receipt of each spin echo signal, z selection can be accomplished. As previously described, the constant k is used to select the plane of interest, with coil 19 driven by $kV_2$. The planes can again be selected to be above or below those planes excited by bursts 51-55. The resultant signals will be due solely to flow in the direction indicated; that is upward or downward depending on whether the plane is selected to be above or below the excited plane.

The signal is again processed by the system shown in FIG. 6 where the spin echo signals are synchronously detected in 91 and the a.c. gradient signal filtered out in 92 with the filtered signal Fourier transformed in 42 to provide the projection signal for the selected plane. As before, due to the finite width of the planar sections, some overlap may exist between the selected plane and the excited plane. This can be dealt with again, as shown in FIG. 6, by first storing the static image in store 95 and then subtracting a weighted amount of the static image from the flow image in 97.

Although many flow imaging systems using an excited selected region have been described, an additional general approach is that of subtraction, as originally described in U.S. application Ser. No. 332,925. Here two projections are formed, either of individual lines or of the entire image, where the only difference between the two is that of flow. Therefore, when the two images are subtracted, the only remaining signal is that due to flow. One example is to use any of the previously described embodiments on the imaging of static materials. Assume that the signal acquisition process is repeated at two different portions of the heart cycle, where the blood velocity is different. These images will differ only in the vessels, since the different velocity will result in signal changes due to the nuclei moving in and out of the selected regions. When these are subtracted, only the vessels remain, with the static material canceled.

In the embodiments shown many operations which improve performance of any NMR system have not been shown since they were not relevant to the specific problem of projection imaging of a selected region. However, they can all be successfully incorporated into this system. For example, for improved SNR, repeated spin echoes can be used which are detected and averaged together. These repeated spin echoes, unlike those of FIG. 7, are for the same region using the same gradient so that the signal is merely repeated for SNR purposes. Another NMR procedure which is widely used is that of a bipolar z gradient signal when a plane is excited to insure that the signals at the edges of the plane produce signals of the correct phase. This would apply to the various z gradient signal segments 57 and has not been shown for convenience and clarity.

What is claimed is:

1. In a method for forming a projection image of the NMR activity of a selected region of a volume the steps of:
   exciting the selected region of the volume with a region-selecting excitation using a magnetic gradient having a component in the projection direction;
   exciting a sequence of planar sections which are parallel to the projection direction and perpendicular to the projection image;
   receiving signals from those regions which have experienced both excitations representing projections in solely one direction; and
   processing the received signals to form the projection image of the selected region of the volume.

2. The method as described in claim 1 wherein the steps of receiving signals and processing the received signals include the steps of receiving signals representing different components of the NMR activity and combining these components to produce NMR images representing specific material properties.

3. The method as described in claim 1 wherein the step of receiving signals include the step of receiving signals of moving materials.

4. The method as described in claim 1 wherein the step of processing the received signals includes the step of removing signals representing static materials.

5. The method as described in claim 1 wherein the step of exciting the selected region includes the step of producing a broadband burst whose frequency range corresponds to the extent of the selected region in conjunction with the magnetic gradient.

6. Apparatus for forming a projection image of the NMR activity of a selected region of a volume comprising:
   means for exciting the selected region of the volume with a region-selecting excitation using a magnetic gradient having a component in the projection direction;
   means for exciting a sequence of planar sections which are parallel to the projection direction and perpendicular to the projection image;
   means for receiving signals from those regions that have experienced both excitations representing projections in solely one direction; and
   means for processing the received signals to form the projection image of the selected regions of the volume.

7. Apparatus as described in claim 6 wherein the magnetic gradient used with the region-selecting excitation also has a component normal to the projection direction whereby the boundaries of the selected region are tilted with respect to the projection plane.

8. Apparatus as described in claim 6 wherein the region-selecting excitation is a broadband burst whose frequency range corresponds to the extent of the selected region in conjunction with the magnetic gradient.

9. Apparatus as recited in claim 8 wherein the region-selecting excitation produces a tipping angle of substantially 90° and the excitation of the planar sections produces a tipping angle of substantially 180° providing a spin echo signal from those regions which have experienced both excitations.

10. Apparatus as recited in claim 8 where the region-selecting excitation produces a tipping angle of substantially 180° and the excitation of the planar sections produces a tipping angle of substantially 90° providing a spin echo signal from those regions which have experienced both excitations.

11. Apparatus as recited in claim 6 including means for making the received signals sensitive to the $T_1$ relaxation time.

12. Apparatus as recited in claim 6 including means for making the received signals sensitive to the $T_2$ relaxation time.

13. Apparatus as recited in claim 6 including means for receiving signals representing different NMR components and where the means for processing the received signals includes means for combining these received signals to produce NMR images representing specific material properties.

14. Apparatus as recited in claim 6 wherein the means for receiving signals includes means for receiving signals from moving materials.

15. Apparatus as recited in claim 14 wherein the processing means includes means for cancelling signals from static materials.

16. Apparatus as recited in claim 14 including an alternating magnetic gradient normal to the planar section whose null plane is adjacent to the excited planar section whereby only moving material which have moved from the excited planar section to the null plane will produce received signals.

17. Apparatus as recited in claim 14 wherein the planar section excitation precedes the region-selecting excitation and both produce substantially 180° flip angles whereby only moving material experiences less than a 180° flip angle in the planar section excitation resulting in received signals.

18. Apparatus as recited in claim 14 including means for producing additional excitations of planar sections adjacent the excited planar sections where the additional excitations produce substantially 180° flip angles resulting in spin echo signals from moving material which has flowed from the excited planar sections to the adjacent planar sections.

19. Apparatus as recited in claim 14 wherein the means for exciting the selected region of the volume includes means for producing substantially a 180° flip angle with the frequency spectrum of the exciting signal consisting of alternate regions of excitation and no excitation whereby only material moving between excited and unexcited regions will experience less than 180° excitation and result in a received signal.

20. Apparatus as recited in claim 14 including means for acquiring signals at two different velocities and subtracting the processed signals to obtain signals representing moving materials.

21. Apparatus as recited in claim 14 including means for using signals representing static materials to cancel residual static material signals in signals representing moving materials.

22. Apparatus as recited in claim 14 including a composite display for simultaneously displaying moving and static materials.

* * * * *